United States Patent [19]

Berthold et al.

[11] Patent Number: 4,587,545
[45] Date of Patent: May 6, 1986

[54] HIGH VOLTAGE DIELECTRICALLY ISOLATED REMOTE GATE SOLID-STATE SWITCH

[75] Inventors: Joseph E. Berthold, Stirling; Adrian R. Hartman, New Providence, both of N.J.; Terence J. Riley, Wyomissing, Pa.; Peter W. Shackle, West Melborne, Fla.

[73] Assignee: AT&T Bell Laboratories, Murray Hill, N.J.

[21] Appl. No.: 248,281

[22] Filed: Mar. 27, 1981

Related U.S. Application Data

[63] Continuation-in-part of Ser. No. 107,780, Dec. 28, 1979, which is a continuation-in-part of Ser. No. 972,022, Dec. 20, 1978, abandoned.

[51] Int. Cl.$^4$ .............................................. H01L 29/72
[52] U.S. Cl. ........................................ 357/38; 357/21; 357/22; 357/39; 357/41; 357/49
[58] Field of Search ...................... 357/21, 22, 38, 39, 357/41, 49

[56] References Cited

U.S. PATENT DOCUMENTS 4,060,821  11/1977  Houston ................................ 357/22

FOREIGN PATENT DOCUMENTS

2102103  7/1971  Fed. Rep. of Germany ........ 357/22
2433981  2/1975  Fed. Rep. of Germany ........ 357/22

*Primary Examiner*—Edward J. Wojciechowicz
*Attorney, Agent, or Firm*—David I. Caplan

[57] ABSTRACT

A high voltage solid-state switch, which provides bidirectional blocking, consists of a first p− type semiconductor body separated from a support member (semiconductor substrate) by a dielectric layer with a p+ type anode region located at one end of the semiconductor body, an n+ type cathode region located at the other end. An n+ type gate region exists in a portion of the semiconductor body other than the portion which directly separates the anode and cathode regions. A second p type region of higher impurity concentration than the semiconductor body surrounds the cathode region. Separate low resistance electrical contacts are made to the anode, cathode, and gate regions and to the substrate. The switch is capable of switching from an "ON" and conducting state to an "OFF" (blocking) state by adjusting the potential of the gate region and without having to adjust the potential of the anode or cathode regions.

4 Claims, 7 Drawing Figures

HIGH VOLTAGE DIELECTRICALLY ISOLATED REMOTE GATE SOLID-STATE SWITCH

CROSS-REFERENCE TO RELATED APPLICATIONS

This application is a continuation-in-part of our co-pending application Ser. No. 107,780, filed Dec. 28, 1979, which is a continuation-in-part of Ser. No. 972,022, filed 12-20-78 now abandoned.

TECHNICAL FIELD

This invention relates to solid-state structures and, in particular, to high voltage solid-state structures useful in telephone switching systems and many other applications.

BACKGROUND OF THE INVENTION

German Pat. No. 2,102,103 discloses a field-effect diode structure having a p− type substrate with an n− type epitaxial layer grown on top of the substrate. The substrate can be replaced by an insulating material. A first p+ type anode region, a second p+ type gate region and an n+ type cathode region exist within portions of the epitaxial layer and each forms a portion of a common surface of the epitaxial layer. The three regions are separated from each other by portions of the epitaxial layer. The patent states that conduction between anode and cathode can only be interrupted by setting the anode voltage to a zero or negative level for a short period of time and by setting the gate voltage to a predetermined critical level. It is undesirable and/or impractical in many applications to have to adjust the anode voltage. Leakage in the diode is stated to cause it to switch on when it should be off. It is unclear how the suggested solution of a register helps solve this problem and whether or not such a register is a discrete component or can be integrated on the same substrate as the diode. It is also unclear how to physically and electrically isolate the diode from other components on the common substrate.

In an article entitled "A Field Terminated Diode" by Douglas E. Houston et al, published in *IEEE Transactions on Electron Devices,* Vol. Ed-23, No. 8, August 1976, and in U.S. Pat. No. 4,060,821 (Douglas E. Houston et al), issued Nov. 29, 1977, there is described a discrete solid-state high voltage switch that has a vertical geometry and which includes a region which can be pinched off to provide an "OFF" state or which can be made highly conductive with dual carrier injection to provide an "ON" state. One problem with this switch is that it is not easily manufacturable with the other like switching devices on a common substrate. Another problem is that the spacing between the grids and the cathode should be small to limit the magnitude of the control grid voltage; however, this limits the useful voltage range because it decreases grid-to-cathode breakdown voltage. This limitation effectively limits the use of two of the devices with the cathode of each coupled to the anode of the other to relatively low voltages. Such a dual device structure would be useful as a high voltage bidirectional solid-state switch. An additional problem is that the base region should ideally be highly doped to avoid punch-through from the anode to the grid; however, this leads to a low voltage breakdown between anode and cathode. Widening of the base region limits the punch-through effect; however, it also increases the resistance of the device in the ON state.

It is desirable to have a solid-state switch which is easily integratable such that two or more switches can be simultaneously fabricated on a common substrate and wherein each switch is adapted such that one terminal thereof controls its state and each switch is capable of bilateral blocking of relatively high voltages and breaking current. One such structure is described in copending U.S. patent applications Ser. Nos. 972,056 and 107,774 filed Dec. 20, 1978 and Dec. 28, 1979, respectively, and in copending U.S. patent application Ser. No. 248,192 (A. R. Hartman-T. J. Riley-P. W. Shackle Case 25-18-30), which is being filed concurrently with this application and has a common assignee. This present application relates to a subsequent improvement in such structures.

SUMMARY OF THE INVENTION

One embodiment of the present invention is a structure comprising a semiconductor body whose bulk is of one conductivity type and which has a major surface. Within the semiconductor body is a localized first region which is of the one conductivity type, and localized second and third regions which are both of the opposite conductivity type. The first, second, and third regions are spaced apart from each other, have separate electrode connections thereto, and are of relatively low resistivity compared to the bulk of the semiconductor body. Each of the three regions has a portion which forms part of the major surface of the semiconductor body. The structure is adapted to selectively facilitate current flow between the first and third regions or to divert a sufficient flow of said current into the second region so as to interrupt (cut off) said current flow between the first and third regions. It is further adapted to selectively inhibit current flowing between the first and third regions. The structure is still further adapted such that selectively during operation there is dual carrier injection. The first and third regions are separated by a portion of the body with the second region being located in a portion of the semiconductor body other than that portion which directly separates the first and third regions. The overall geometry and impurity concentrations of the structure have been selected so as to aid in the inhibiting or interrupting of current flow between the first and third regions.

In a preferred embodiment the semiconductor body is of p− type conductivity and is isolated from a semiconductor support by a dielectric layer and a plurality of said bodies are formed in said support and are separated from each other by at least a dielectric layer. The first, second, and third regions serve as the anode, gate, and cathode, respectively, of the structure.

The structure of the present invention, when suitably designed, can be operated as a switch that is characterized by a low impedance path between anode and cathode when in the ON state and a high impedance path between anode and cathode when in the OFF (blocking) state. The potential applied to the gate region determines the state of the switch. In a preferred embodiment the semiconductor support is biased at the most positive potential used with the structure when the semiconductor body is of p− type conductivity and at the most negative potential when it is of n− type conductivity. The biased semiconductor support member serves to aid in establishing the OFF state. There is no need to adjust the potentials of the anode or the cathode to cause the switch to assume the OFF state. The switch inhibits or interrupts (cuts off) conduction between the anode and cathode when it is set to the OFF state. During the ON state, with appropriate potentials applied to the anode and cathode, there is dual carrier injection that results in the resistance between anode and cathode being relatively low.

This structure, which is to be denoted as a gated diode switch (GDS), when suitably designed, is capable in the OFF state of blocking relatively large potential differences between anode and cathode regions, independent of polarity, and is capable in the ON state of conducting relatively large amounts of current with a relatively low voltage drop between anode and cathode.

Arrays of these GDS can be fabricated on a single integrated circuit chip together with other high voltage circuit components. The bilateral blocking characteristic of the structure facilitates its use in a bidirectional switch formed by two of the structures of the present invention with the cathode of each coupled to the anode of the other and the gates being coupled together.

These and other novel features and advantages of the present invention are better understood from consideration of the following detailed description taken in conjunction with the accompanying drawing.

DETAILED DESCRIPTION

Figure 1:
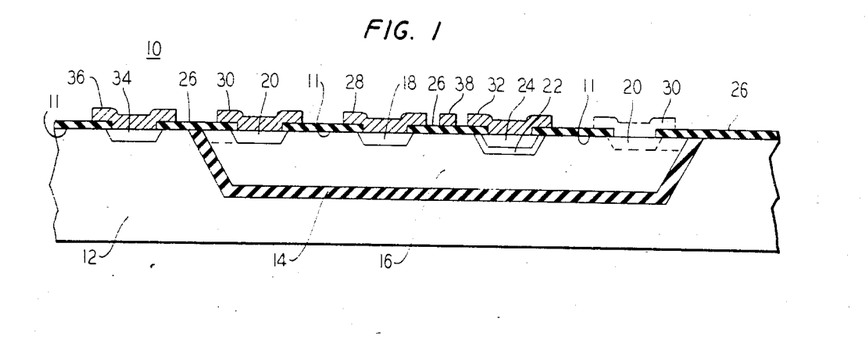
FIGS. 1 and 2 illustrate a cross-sectional and a top view, respectively, of a structure in accordance with an embodiment of the invention.
Figure 2:
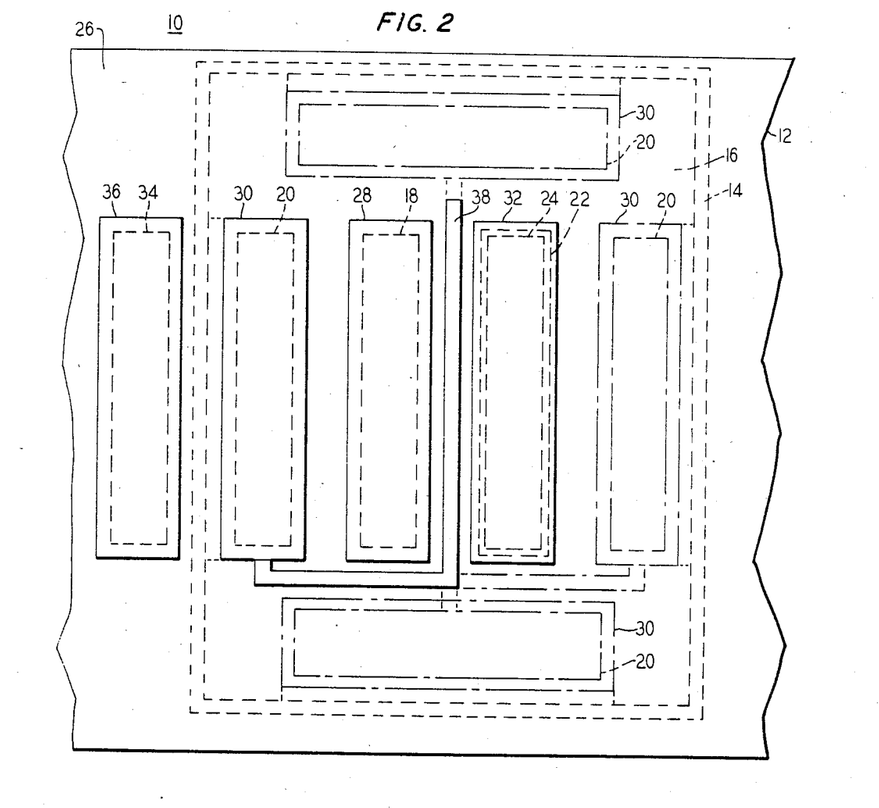

Referring now to FIGS. 1 and 2, there is illustrated a cross-sectional and a top view, respectively, of a structure 10 having a major surface 11 and comprising a support member 12 and a semiconductor body 16 which is of one conductivity type. The semiconductor body has a portion that is common with surface 11. Body 16 is separated from support member 12 by an insulator layer 14. Support member 12 is typically a semiconductor substrate, and insulator layer 14 is typically a dielectric layer.

A semiconductor gate region 20, which is of the opposite conductivity type, is included in body 16 at one end thereof and has a portion thereof that extends to surface 11. Gate region 20 can exist on the left side of body 16, on the right side of body 16 (as is illustrated by the dashed lines of FIG. 1), or in the front of or the rear of body 16 (as illustrated by the dashed lines of FIG. 2). Region 20 can be separated from dielectric layer 14 by a portion of body 16 or can, as is illustrated by the dashed lines of FIG. 1, extend so as to come in contact with a portion of dielectric layer 14.

A semiconductor anode region 18, which is of the one conductivity type, is included in body 16 and is separated from region 20 by portions of body 16. A semiconductor cathode region 24 of the opposite conductivity type is included in body 16 and is encircled by a semiconductor region 22. Region 22, which is of the one conductivity type and of resistivity intermediate between that of body 16 and anode region 18, acts to prevent voltage punch-through and to inhibit an inversion layer being formed in body 16. It also acts to increase the voltage blocking capability between the gate region 20 and cathode region 22. In a portion of substrate 12 outside of dielectric layer 14 and body 16 there exists a semiconductor region 34 which is of the same conductivity type as substrate 12 but is of lower resistivity.

Portions of regions 18, 20, 24 and 34 extend to surface 11 and allow low resistance contact to be made to these regions. Region 22 also has a portion which extends to surface 11. Regions 28, 30, 32, and 36 are electrodes which make low resistance contact to regions 18, 20, 24, and 34, respectively. A dielectric layer 26 covers major surface 11 so as to isolate electrodes 28, 30, 32, and 36 from all regions other than those intended to be electrically contacted.

A conductor region 38, which is optional, exists on top of layer 26 and is located in between electrodes 28 and 32. Region 38 is electrically coupled to electrode 30. Region 38 helps reduce the magnitude of the gate voltage necessary in the operation of structure 10.

In one illustrative embodiment, substrate 12, body 16 and regions 18, 20, 22, 24, and 34 are of n, p−, p+, n+, p, n+, and n+ type conductivity, respectively. Dielectric layer 14 is silicon dioxide and electrodes 28, 30, 32, and 36, and conductor region 38 are all aluminum. Substrate 12 and region 34 could also be of p and p+ type conductivity, respectively.

A plurality of separate bodies 16 can be formed in a common support to provide a plurality of switches.

Structure 10 is typically operated as a switch which is characterized by a low impedance path between anode region 18 and cathode region 24 when in the ON state and as a high impedance between said two regions when in the OFF (blocking) state. The type of structure described herein is denoted as a gated diode switch (GDS). Substrate 12 is typically held at the most positive potential level available when body 16 is of p− type conductivity. It is held at the most negative potential level available when body 16 is of n− type conductivity. With operating potentials applied to the regions 18 and 24, the potential applied to gate region 20 determines the state of the switch. Regions 18 and 24 serve as the anode and cathode regions, respectively, when semiconductor body 16 is of p− type conductivity. Regions 18 and 24 serve as the anode and cathode regions, respectively, when semiconductor body 16 is of n− type conductivity.

With body 16 being of p− type conductivity, conduction between anode region 18 and cathode region 24 is inhibited or interrupted (cut off) if the potential of gate region 20 is sufficiently more positive than that of anode region 18, cathode region 24, and region 22. The amount of excess positive potential needed to inhibit or interrupt (cut off) conduction is a function of the geometry and impurity concentration (doping) levels of structure 10. The use of conductor region 38 has been shown to reduce the magnitude of the potential which must be applied to gate region 20 to inhibit or interrupt (cut off) conduction between anode region 18 and cathode region 24. This positive gate potential causes a vertical cross-sectional portion of body 16 between gate region 20 and the portion of dielectric layer 14 therebelow to be depleted and the potential of this portion of the bulk of body 16 to be greater in magnitude than that of anode region 18, cathode region 24, and region 22. This positive potential barrier inhibits the conduction of holes from anode region 18 to cathode region 24. It essentially pinches off body 16 against dielectric layer 14 in the bulk portion thereof below gate region 20 and extending down to dielectric layer 14. If conduction exists between anode region 18 and cathode region 24 before the potential of the gate region 20 is raised to the high potential level, then gate region 20 serves to collect electrons emitted at cathode region 24 before they can reach anode region 18. This serves to help interrupt conduction between anode region 18 and cathode region 24. In addition, the high level potential of gate region 20 serves to cause a vertical cross-sectional portion of body 16 below conductor 38 and region 20 and the portion of dielectric layer 14 therebelow to be depleted and the potential of this portion of body 16 to be greater in magnitude than that of anode region 18, cathode region 24, and region 22. The blocking (essentially nonconducting) state, is the OFF state. The geometry and impurity concentrations of structure 10 are designed to help inhibit or interrupt current flow between anode region 18 and cathode region 24.

The voltage applied to semiconductor support 12 causes an electric field which extends through dielectric layer 14 and into semiconductor body 16. Normally, during the ON state, electrons coat the bottom of semiconductor body 16 and act to shield it from the effect of the positive bias applied to substrate 12. With structure 10 biased to the OFF state, these electrons are removed from the bottom of semiconductor body 16 and drawn into gate region 20. This field tends to cause depletion of semiconductor body 16 and also helps cause the potential of the portion of the bulk portion of body 16 between gate region 20 and conductor 38 and extending down to dielectric layer 14 to be greater in potential than anode region 18. The biased substrate 12 thus acts as a second or back gate which aids in switching structure 10 to the OFF state. Control circuitry capable of supplying the needed gate potentials and absorbing the electrons is illustrated and described in U.S. patent application Ser. No. 248,206 (A. R. Hartman-T. J. Riley-P. W. Shackle Case 27-20-32), which is being filed concurrently with this application and which has a common assignee.

With semiconductor body 16 being of p— type conductivity, conduction from anode region 18 to cathode region 24 occurs if region 18 is forward-biased with respect to region 24 and the potential of gate region 20 is below a level which inhibits or interrupts conduction between anode region 18 and cathode region 24. During the ON state holes are injected into body 16 from anode region 18 and electrons are injected into body 16 from cathode region 24. These holes and electrons can be in sufficient numbers to form a plasma which conductivity modulates body 16. This effectively lowers the resistance of body 16 such that the resistance between anode region 18 and cathode region 24 is relatively low when structure 10 is operating in the ON state. This type of operation is denoted as dual carrier injection. Positively biased substrate 12 creates an electrical field which passes through the dielectric layer 14 and tends to deplete the bulk portion of body 16. Electrons emitted from cathode region 24 coat the bottom of body 16 and thus act to shield the effect of the electrical field created by biased substrate 12. These electrons invert the bottom of the bulk portion of body 16 which is adjacent dielectric layer 14. This limits the effect of biased substrate 12 and thus allows conduction between anode region 18 and cathode region 24.

Region 22 helps limit the punch-through of a depletion layer formed during operation between gate region 20 and cathode region 24 and helps inhibit formation of a surface inversion layer between these two regions. It serves to increase maximum operating voltage and to reduce leakage currents.

During the ON state of structure 10, the junction diode comprising semiconductor body 16 and gate region 20 can become forward-biased. Current limiting means (not illustrated) are normally included to limit the conduction through the forward-biased diode. One example of such current limiting means is illustrated and described in U.S. patent application Ser. No. 248,206 (A. R. Hartman et al Case 27-20-32).

The ON state can be achieved by having the potential of the anode region 18 greater than that of the cathode region 24 and forward-biasing the anode region 18 with respect to the gate region 20. Typically, 1-10 microamperes are pulled out of the gate region 20 while the anode-gate junction is forward-biased to cause structure 10 to assume the ON state.

It is possible to operate structure 10 in the ON state with the potential of gate region 20 at the same or a more positive level than that of anode region 18, cathode region 24, and region 22, so long as the potential of gate region 20 is below a level which essentially completely depletes a vertical cross-sectional portion of semiconductor body 16 between anode region 18 and cathode region 24. With the gate region 20 held at such a potential level, the junction diode comprising semiconductor body 16 and gate region 20 has a zero forward bias or is reverse-biased.

Structure 10 is designed such that anode region 18 and cathode region 24 can be spaced relatively closely to each other in order to provide relatively low resistance between the two during the ON (conducting) state. Structure 10 is similar to a structure described in copending U.S. patent application Ser. No. 107,774, and Ser. No. 248,192 (A. R. Hartman-T. J. Riley-P. W. Shackle Case 25-18-30) which is being filed concurrently with the present case and in which there are some common inventors and a common assignee, except that the gate region is located in a portion of semiconductor body 16 other than directly between the anode 18 and cathode 24 regions. The improvement of the present structure over the structure of the above-described copending application is that the anode and cathode regions can be more closely spaced and the resulting resistance during the ON (conducting) state is lowered.

Figure 3:
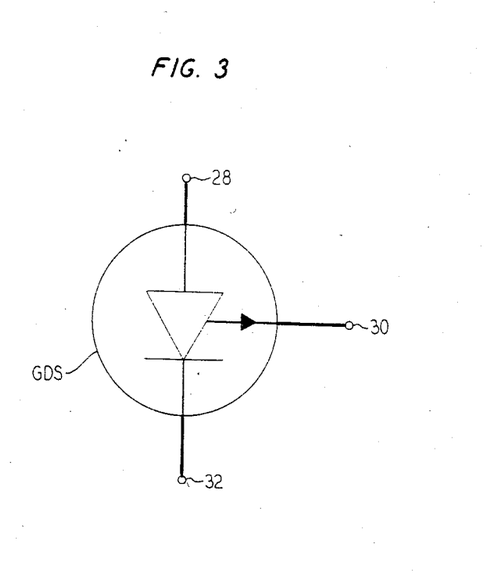
FIG. 3 illustrates a proposed electrical symbol for the structure of FIGS. 1 and 2.

FIG. 3 illustrates an adopted symbol for this type of switch. The anode, gate, and cathode electrodes of the GDS are denoted as 28, 30, and 32, respectively.

One embodiment of structure 10 has been fabricated with the following design. Semiconductor substrate 12 is an n type silicon substrate, 18 to 22 mils thick, with an impurity concentration of approximately $5 \times 10^{13}$ impurities/cm$^3$, and is 100 ohm-centimeter type material. Dielectric layer 14 is silicon dioxide that is typically 2 to 4 microns thick. Body 16 is typically 30 to 40 microns thick, approximately 430 microns long, 170 microns wide, and is of p— type conductivity with an impurity concentration of approximately $5-9 \times 10^{13}$ impurities/cm$^3$. Anode region 18 is of p+ type conductivity, is typically 2 to 4 microns thick, 28 microns wide, 55 microns long, and has an impurity concentration of approximately $10^{19}$ impurities/cm$^3$. Electrode 28 is aluminum, with a thickness of 1½ microns, a width of 55 microns, and a length of 95 microns. Gate region 20 is of n+ type conductivity, is typically 2 to 4 microns thick, 38 microns wide, 55 microns long, and has an impurity concentration of approximately $10^{19}$ impurities/cm$^3$. Electrode 30 is aluminum with a thickness of 1½ microns, a width of 76 microns, and a length of 95 microns. The spacing between adjacent edges of electrodes 28 and 32 is typically 40 microns (with no region 38) and the spacing between adjacent edges of electrodes 28 and 30 is typically 40 microns. Region 22 is of p type conductivity and is typically 3.5 microns thick, 44 microns wide, 44 microns long, and has a surface impurity concentration of approximately $10^{18}$ impurities/cm$^3$. Cathode region 24 is of n+ type conductivity and is typically 2 microns thick, 30 microns wide, 30 microns long, and has an impurity concentration of approximately $10^{19}$ impurities/cm$^3$. Electrode 32 is aluminum, 1½ microns thick, 82 microns wide, and 82 microns long. The spacing between the ends of electrodes 28 and 32 and the respective ends of p− type body 16 is 50 microns. Conductor region 38, which is aluminum, is spaced 30 microns apart from electrodes 28 and 32 and is 10 microns wide, 1½ microns thick, and 75 microns long. Conductor region 38 makes electrical contact to electrode 30 in the front or rear of region 16. The dielectric layer 26 is typically 3–5 microns thick.

Structure 10, using the parameters denoted above, has been operated as a gated diode switch with 400 volts between anode and cathode. The anode had +200 volts applied thereto and the cathode had −200 volts applied thereto. The −200 volts can also be applied to the anode and the +200 volts can be applied to the cathode. Thus, structure 10 bilaterally blocks voltage between anode and cathode. With conductor region 38 being present, a potential of +210 volts was found sufficient to break 1 mA of current flow between anode and cathode. It is estimated that this voltage need be 20 volts higher if conductor region 38 is eliminated. The ON resistance of the gated diode switch with 100 mA flowing between anode and cathode was approximately 10–12 ohms and the voltage drop between anode and cathode is typically 2.2 volts. A layer of silicon nitride (not illustrated) was deposited by chemical vapor deposition on top of silicon dioxide layer 26 to act as a sodium barrier. Electrodes 28, 30, 32, and 36 were then formed and a coating of ratio frequency plasma deposited silicon nitride (not illustrated) was applied to the entire surface of structure 10. The layers of silicon nitride serve to help prevent high voltage breakdown in the air between adjacent electrodes.

Figure 4:
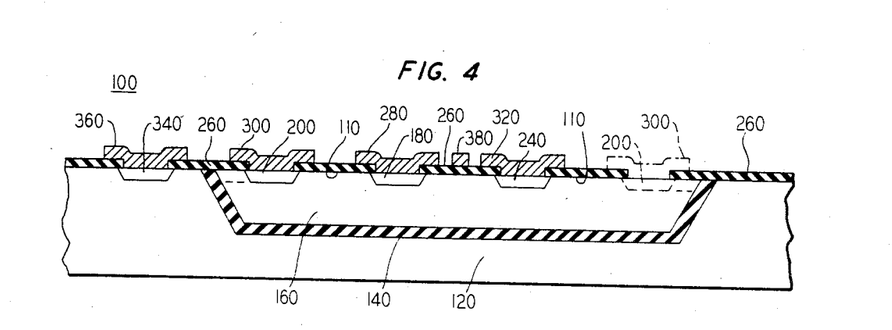
FIG. 4 illustrates a structure in accordance with another embodiment of the invention.

Referring now to FIG. 4, there is illustrated a structure 100. Structure 100 is very similar to structure 10 and all components thereof which are essentially identical or similar to the corresponding components of structure 10 are denoted by the same reference number with the addition of a "0" at the end. The basic difference between structures 10 and 100 is the elimination in structure 100 of a corresponding region to that of region 22 of structure 10. Appropriate spacing of anode region 180 from cathode region 240 provides sufficient protection against depletion layer punch-through to facilitate the use of structure 100 as a high voltage switch.

Figure 5:
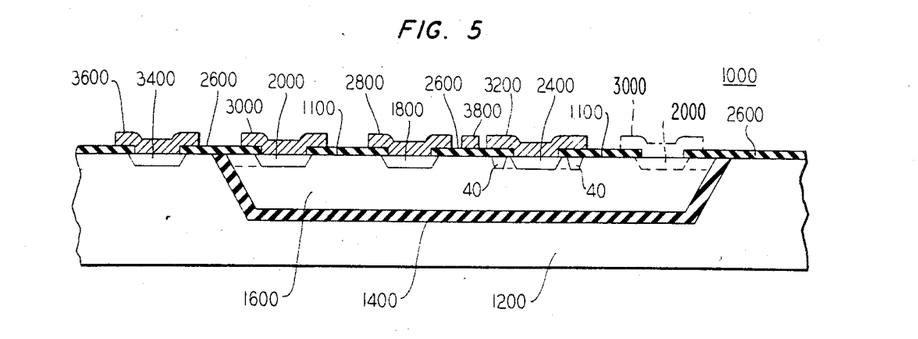
FIG. 5 illustrates a structure in accordance with still another embodiment of the invention.

Referring now to FIG. 5, there is illustrated a structure 1000. Structure 1000 is very similar to structure 10 and all components thereof which are essentially identical or similar to the corresponding components of structure 10 are denoted by the same reference number with the addition of two "0s" at the end. The basic difference between structures 10 and 1000 is the substitution of a semiconductor guard ring region 40 around cathode region 2400 instead of a region like region 22 of structure 10 of FIG. 1. Guard ring 40 can be separated from cathode region 2400 or, as is illustrated by the dashed lines, it can be extended so as to come into direct contact therewith. The surface inversion protection provided by guard ring 40 is believed adequate to allow high voltage operation. Guard ring 40 is of the same conductivity type as body 1600 but of lower resistivity.

It has been discovered that decreasing the impurity concentration of the bulk portion of semiconductor body 16 of structure 10 of FIG. 1 causes a modification in the mode of operation. Starting with the above design parameters, but with the impurity concentration of the bulk of semiconductor body 16 at approximately $1 \times 10^{13}$ instead of $9 \times 10^{13}$ impurities/cm$^3$, it was found that with the potential of gate region 20 at approximately the same level as anode region 18, conduction between anode region 18 and cathode region 24 is inhibited or interrupted (cut off) except for a relatively low level flow. This is the OFF (high impedance) state. With a positive bias applied to anode region 18 relative to cathode region 24, and with gate region 20 allowed to essentially electrically float in potential, substantial current flow can exist between anode region 18 and cathode region 24. The relatively low level current flow of the OFF state helps in switching structure 10 to the ON state. This is the ON (low impedance) state. Control circuitry useful to control the state of a structure 10 which has the operating characteristics described in this paragraph is described in U.S. patent application Ser. No. 248,206 (A. R. Hartman-T. J. Riley-P. W. Shackle Case 27-20-32), which is being filed concurrently with the present application and which is a continuation-in-part of U.S. patent application Ser. No. 107,771, filed Dec. 28, 1979. Ser. No. 107,771 is in itself a continuation-in-part of U.S. patent application Ser. No. 972,023, abandoned June 24, 1980.

One major advantage of structure 10, which has a semiconductor body 16 whose impurity concentration is as described immediately hereinabove, is that the magnitude of the gate potential need only be at that of the anode potential to switch the structure to the OFF state. It is thus not necessary to use a higher potential than exists at the anode in order to operate structure 10. Many applications require high voltage and high current switches but the most positive potential available is that applied to one of the terminals of the switch. This embodiment of structure 10 can be used in such applications so long as a limited amount of current flow can be tolerated between the anode and cathode regions when structure 10 is in the OFF state. It is, however, necessary to maintain fairly tight tolerances on the impurity concentration of semiconductor body 16 in order to operate structure 10 as indicated.

Figure 6:
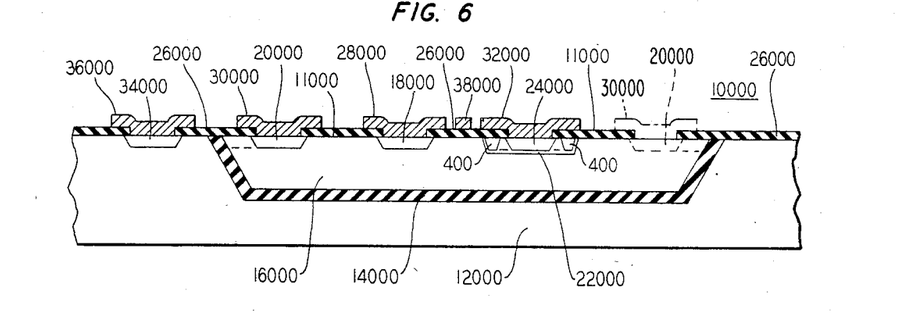
FIG. 6 illustrates a structure in accordance with still another embodiment of the invention.

Referring now to FIG. 6, there is illustrated a solid-state structure 10,000. Structure 10,000 is very similar to structure 10 and all components which are essentially identical or similar are denoted by the same reference number with the addition of three "0s" at the end. The main difference between structure 10,000 and structure 10 is the use of a semiconductor guard ring region 400 around cathode 24,000. Guard ring 400 is similar to guard ring 40 of structure 1000 of FIG. 5. The dashed line portion of guard ring 400 illustrates that it can be extended so as to contact cathode 24,000. The combination of region 22,000 and guard ring 400 provides protection against inversion of body 16,000, particularly between gate region 20,000 and cathode region 24,000, and provides protection against depletion layer punchthrough to cathode region 24,000. This type of dual protection around cathode region 24,000 is the preferred protection structure. Guard ring 400 is of the same conductivity type as region 22,000 but is of lower resistivity.

Figure 7:
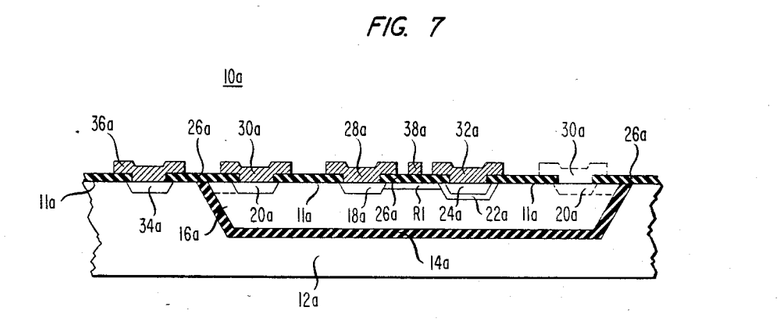
FIG. 7 illustrates a structure in accordance with still another embodiment of the invention.

Referring now to FIG. 7, there is illustrated a structure 10a which is very similar to structure 10 of FIG. 1 and all components thereof which are essentially identical or similar to structure 10 are denoted with the same reference number with the addition of an "a". The basic difference between structures 10a and 10 is the existence of a resistive-type region R1 in structure 10a which coupled anode region 18a to shield region 22a. The inclusion of region R1 allows structure 10a to be operated with the maximum needed gate potential being approximately equal to the anode potential and allows for a considerably wider variation in the impurity concentration of semiconductor body 16a than is possible if R1 is not utilized. R1 serves to provide a predictable high impedance path between anode region 18a and shield region 22a. Variations in the impurity concentration of semiconductor body 16a thus become less critical since a high impedance path is established between anode region 18a and shield region 22a and this path exists relatively independent of the impurity concentration of semiconductor body 16a. Typically, the impurity concentration of semiconductor body 16a is between $2 \times 10^{12}$ impurities/cm$^3$ and $2 \times 10^{13}$ impurities/cm$^3$. R1 can be ion implanted or diffused into semiconductor body 16a. A discrete resistor could be connected between anode electrode 28a and region 22a, provided an electrode (not illustrated) is provided which is in contact with region 22a. This resistor would serve essentially the same purpose as R1. In a preferred embodiment, R1 is an ion implanted pinch resistor that limits the current flow therethrough and is of the same conductivity type as regions 18a and 22a. Region 22a can be eliminated in some applications. In this case R1 extends so as to contact cathode region 24a. A discrete R1 could instead be connected to a p+ type contact region (not illustrated) within body 16a and located close to the cathode region 24a.

The embodiments described herein are intended to be illustrative of the general principles of the present invention. Various modifications are possible consistent with the spirit of the invention. For example, semiconductor substrate region 12 can be p type conductivity silicon with region 34 being p+ type conductivity. Region 12 can alternately be gallium arsenide, sapphire, a conductor, or an electrically inactive material. If region 12 is an electrically inactive material, the insulator (dielectric) layer 14 can be eliminated. Still further, body 16 can be fabricated as an air-isolated structure. This allows for the elimination of region 12 and dielectric layer 14. Still further, an insulator (dielectric) layer of silicon nitride or Semi-Insulating Polycrystalline Oxygen Doped Silicon (SIPOS) or other dielectric materials can be substituted for the silicon dioxide layer 14. Still further, the electrodes can be doped polysilicon, gold, titanium, or other types of conductors. Still further, the impurity concentration levels, spacings between different regions, and other dimensions of the regions can be adjusted to allow significantly higher operating voltages and currents than are described. Still further, the conductivity type of all regions within the dielectric layer can be reversed provided the voltage polarities are appropriately changed in the manner well known in the art. A reversal of conductivity types results in the anode and cathode being reversed. It is to be appreciated that the two structures of the present invention with common gates and the anode of each coupled to the cathode of the other allows alternating or direct current operation. A bilateral switch comprising two of the disclosed structures with the gates being common and the anode of each coupled to the cathode of the other is easily formed. A resistive-type region like R1 of FIG. 7 can be used between: anode region 180 and cathode region 240 of structure 100 of FIG. 4, anode region 1800 and region 40 of structure 1000 of FIG. 5, and anode region 18,000 and region 22,000 of structure 10,000 of FIG. 6. The addition of a region like R1 to each of these structures, and the choice of an appropriate impurity concentration for the corresponding semiconductor bodies, allows these structures to be operated in a similar fashion to structure 10a of FIG. 7. Still further, a single semiconductor substrate can contain some semiconductor bodies which are of p− type conductivity and others which are of n− type conductivity.

What is claimed is:

1. A switching element comprising a semiconductor body having a bulk region which is of one conductivity type and of relatively high resistivity and which includes anode, gate, and cathode regions being mutually spaced apart and localized along a common planar surface of the bulk region, each being of relatively low resistivity, the cathode and gate regions being of the opposite conductivity type from that of the bulk and the anode region being of the same conductivity type as that of the bulk, and separate cathode, anode and gate electrodes separately attached to the cathode; anode, and gate region, respectively, a semiconductor substrate and a dielectric layer; the semiconductor body being separated from the semiconductor substrate by the dielectric layer; the semiconductor substrate having a separate electrode coupled thereto for application thereto of the most positive potential used with the switching element if the semiconductor body is of p type conductivity, and at the most negative potential used with the switching element if the semiconductor body is of n− type conductivity; the gate region being located in a portion of the semiconductor body removed from the portion thereof located directly between the anode and cathode regions; the parameters of the various portions of the switching element being such that with the potential of the anode region being forward bias with respect to the cathode region and the potential of the gate region being insufficient to essentially completely deplete a cross-sectional portion of the bulk of the semiconductor body between the anode and cathode regions there is facilitated a current flow between the anode and cathode regions via the bulk, and with the anode region being forward biased with respect to the cathode region and the potential of the gate region being of sufficiently greater magnitude than that of the anode region to essentially completely deplete a cross-sectional portion of the bulk of the semiconductor body between the anode and cathode regions and to cause this portion of the bulk of the semiconductor body to be at a potential which is greater in magnitude than the anode region, there is facilitated an interrupting of current flow between the anode and cathode regions.

2. A switching element in accordance with claim 1 further comprising:
a semiconductor shield region within the semiconductor body and being of the one conductivity type and of resistivity intermediate between that of the bulk region and the first region;
the semiconductor shield region surrounding the cathode region so as to separate it from the bulk region of the semiconductor body; and
the semiconductor shield region being separated from the anode and gate regions by portions of the bulk of the semiconductor body.

3. A plurality of switching elements in accordance with claim 2 with each included in the semiconductor wafer and dielectrically isolated from one another.

4. A pair of switching elements each in accordance with claim 1 with the gate electrodes of the pair connected to one another and the anode electrode of each connected to the cathode electrode of the other to provide a bilateral switch.

* * * * *